US011942328B2

(12) United States Patent
Fournier et al.

(10) Patent No.: US 11,942,328 B2
(45) Date of Patent: Mar. 26, 2024

(54) METHOD OF MAKING A DISTRIBUTED BRAGG MIRROR

(71) Applicant: COMMISSARIAT A L'ENERGIE ATOMIQUE ET AUX ENERGIES ALTERNATIVES, Paris (FR)

(72) Inventors: Maryse Fournier, Grenoble (FR); Vincent Reboud, Grenoble (FR); Jean-Marc Fedeli, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 293 days.

(21) Appl. No.: 17/457,362

(22) Filed: Dec. 2, 2021

(65) Prior Publication Data
US 2022/0181850 A1 Jun. 9, 2022

(30) Foreign Application Priority Data

Dec. 3, 2020 (FR) ..................................... 20 12650

(51) Int. Cl.
| | |
|---|---|
| *H01L 21/3065* | (2006.01) |
| *H01S 5/12* | (2021.01) |
| *H01S 5/125* | (2006.01) |
| *H01S 5/20* | (2006.01) |

(Continued)

(52) U.S. Cl.
CPC ........ *H01L 21/3065* (2013.01); *H01S 5/1231* (2013.01); *H01S 5/125* (2013.01); *H01S 5/209* (2013.01); *H01S 5/22* (2013.01); *H01S 5/2202* (2013.01); *H01S 5/3401* (2013.01); *H01S 5/12* (2013.01); *H01S 2301/176* (2013.01)

(58) Field of Classification Search
None
See application file for complete search history.

(56) References Cited

U.S. PATENT DOCUMENTS

| 7,567,606 B2 | 7/2009 | Carras et al. |
| 2005/0276298 A1 | 12/2005 | Fischer et al. |
| 2008/0137704 A1 | 6/2008 | Fischer et al. |

(Continued)

FOREIGN PATENT DOCUMENTS

WO    WO 2005/122351 A1    12/2005

OTHER PUBLICATIONS

Fuchs et al., "Single mode quantum cascade lasers with shallow-etched distributed Bragg reflector", Optics Express, vol. 20, pp. 3890-3897. (Year: 2012).*

(Continued)

*Primary Examiner* — Jiong-Ping Lu
(74) *Attorney, Agent, or Firm* — Oblon, McClelland, Maier & Neustadt, L.L.P.

(57) ABSTRACT

A method for forming a Bragg reflector includes after forming first trenches in the stack, which are intended to form structures of the distributed Bragg reflector, forming a sacrificial interlayer at least in the first trenches, depositing a second masking layer at least inside the first trenches, forming second trenches intended to form sidewalls of the laser, removing the second masking layer from inside the first trenches, removing said sacrificial interlayer so as to remove, by lift-off, residues of the second masking layer that remain inside the first trenches, and filling said first trenches with at least one metal material.

11 Claims, 10 Drawing Sheets

(51) Int. Cl.
    H01S 5/22      (2006.01)
    H01S 5/34      (2006.01)

(56) References Cited

U.S. PATENT DOCUMENTS

2015/0333482 A1    11/2015  Briggs et al.
2017/0170633 A1*   6/2017   Tsuji ..................... H01S 5/124
2018/0375293 A1    12/2018  Hashimoto

OTHER PUBLICATIONS

French Preliminary Search Report dated Jun. 28, 2021 in French Application 20 12650 filed on Dec. 3, 2020(with English Translation of Categories of Cited Documents & Written Opinion), 12 pages.

Chastanet et al., "High Temperature, Single Mode, Long Infrared ([lambda]=17.8 [mu]m) InAs-based quantum cascade Lasers", Applied Physics Letters, vol. 105, No. 11, 2014, 4 pages.

Chen et al., "Single-mode Operation of Terahertz Quantum Cascade Lasers" International Symposium on Photoelectronic Detection and Imaging 2011: Terahertz Wave Technologies and Applications vol. 8195, No. 1, 2011, 8 pages.

Coutard et al., "Volume Fabrication of Quantum Cascade Lasers on 200 mm-CMOS Pilot Line" Scientific Reports, vol. 10, No. 1, 2020, 8 pages.

Yu et al., "High-Power, Room-Temperature, and Continuous-Wave Operation of Distributed-Feedback Quantum-Cascade Lasers at $\lambda \sim 4.8 \mu m$", Applied. Physics Letter vol. 87, Issue 4, 2005, 1 page.

Kohler et al., "Single-mode tunable, pulsed, and continuous wave quantum-cascade distributed feedback lasers at $\lambda \cong 4.6$-$4.7$ $\mu m$", Applied Physics Letter 76, 1092, 2000, 1 page.

Hofstetter et al., "High-Temperature Operation of Distributed Feedback Quantum-Cascade Lasers at 5.3 µm", Applied Physics Letter 78, 396-398, 2001, 3 pages.

Carras et al., "Top Grating Index-Coupled Distributed Feedback Quantum Cascade Lasers", Applied Physics Letters vol. 93, Issue 1, 2008, 2 pages.

Kotidis, "Quantum-Cascade Lasers: QCLs Enable Applications in IR Spectroscopy", Laser Focus World, 2013, 3 pages.

* cited by examiner

METHOD OF MAKING A DISTRIBUTED BRAGG MIRROR

TECHNICAL FIELD

The present invention relates to the field of optoelectronics. It can be implemented to produce light-emitting components, in particular emitting light in the mid-infrared (MIR) region. One particularly advantageous application is that of the production of distributed Bragg reflectors for quantum cascade laser sources using CMOS-compatible technology. One specific example application is that of environmental sensors using MIR sources.

PRIOR ART

Figure 1:
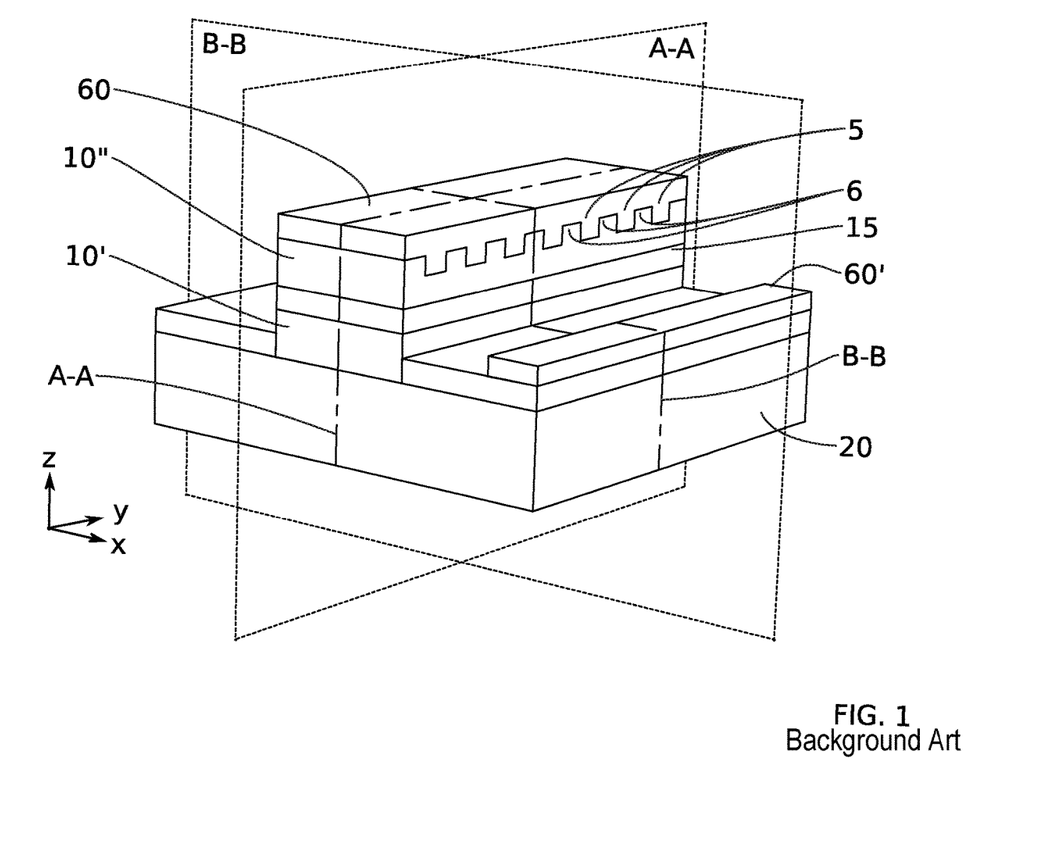
FIG. 1 diagrammatically shows a DFB laser comprising a metal Bragg reflector in the upper portion thereof.

A Bragg reflector allows light radiation of a given wavelength λ to be reflected with a reflectivity R greater than 99%. Such a reflector 65 typically comprises a periodic array of grating structures 5, 6 with different refractive indices (FIG. 1). Partial reflection of the light radiation occurs with each index change. For a grating period in the order of λ/2n, where n is the effective refractive index, the partial reflections combine with constructive interference, and the structures "distributed" along the grating act as a high-quality reflector. Such a reflector is also referred to as a "distributed Bragg reflector".

Bragg reflectors are thus particularly advantageous in the manufacture of optical cavities for laser applications, and in particular in the manufacture of single-mode lasers with a very narrow spectral width.

A laser with a distributed Bragg reflector is referred to as a DFB (Distributed FeedBack) laser. This laser can also be based on a principle of quantum cascade amplification. Such a laser is thus referred to as a QCL (Quantum Cascade Laser). Among the many applications of DFB-QCLs, the detection of chemical or biological elements ($CO_2$, $CH_4$, $NH_3$ etc., glucose etc.) is of particular interest, insofar as the very narrow spectral width thereof allows the detection sensitivity to advantageously be enhanced.

One known DFB-QCL architecture is shown in FIG. 1. Such an architecture typically comprises an active region 15 bordered by lower 10' and upper 10" guide layers, and a Bragg reflector 65 in the upper portion. The Bragg reflector 65 is typically metal-based, and can also act as an injection electrode 60 for electrical pumping of the laser. The active region 15 and the guide layers 10', 10" can typically be formed from a III-V material-based mesa transferred onto a silicon substrate 20. The guide layers 10', 10" allow the optical modes of the light radiation to be confined within the active region 15, which thus forms a waveguide for the propagation of the light radiation along y, as shown in FIG. 1. This approach, combining a metal upper reflector and a waveguide, limits the optical losses, by interaction between the plasmon modes due to the metal and the propagative modes in the waveguide.

In practice, the Bragg reflector can be produced by corrugating the upper portion of the guide layers. Trenches are thus formed transversely to the waveguide and filled with metal.

The document "Volume Fabrication of Quantum Cascade Lasers on 200 mm-CMOS pilot line, Coutard et al, Scientific Reports|Nature research (2020)" discloses a method for manufacturing such a distributed metal Bragg reflector at the upper portion of a QCL. After transferring a mesa made of an III-V material onto a Si substrate, a first hard mask is formed on the upper guide layers by UV lithography, so as to define distributed Bragg reflector patterns. The upper guide layers are then etched through these patterns, typically by anisotropic dry etching, to form trenches. A second hard mask is then formed on the first hard mask and in the trenches, so as to define a ribbon pattern for the laser. The stack of III-V layers is then etched to form the sidewalls of the laser ribbon. The second hard mask is then removed from the trenches. The sidewalls of the laser ribbon can be passivated with a passivation layer, leaving an opening for accessing the trenches. The trenches are then filled with metal and the electrical contacts are formed.

Figure 2:
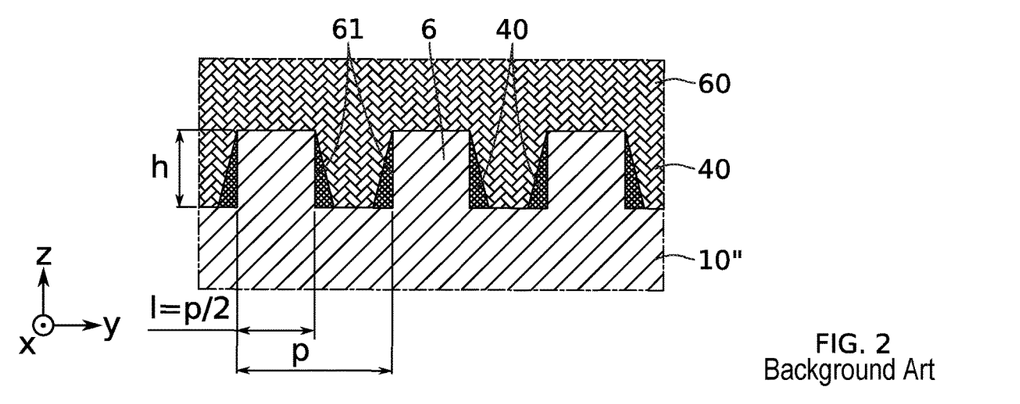
FIG. 2 diagrammatically shows a longitudinal sectional view of the residues between the corrugations of a Bragg reflector formed by a method according to the prior art.

One difficulty with this method concerns the need to carefully remove the hard mask from the trenches before filling with metal. Trench cleaning is generally imperfect. This results in the presence of hard mask residues 40 at the bottom of the trenches (FIG. 2). These residues 40 thus result in partial filling of the trenches of the Bragg reflector with metal.

One drawback of this partial filling is that the contact area between the metal and the upper guide layers is thus reduced. In the example shown in FIG. 2, the residues 40 typically form on the sidewalls 61 of the corrugations 6. These residues 40 reduce the contact area between the electrode 60 and the upper layers 10" by about 66%. The contact resistance increases proportionally. The electrical injection efficiency is thus reduced. QCL performance is degraded.

Another drawback caused by the partial filling of the trenches with the metal relates to the optical functioning of the reflector. In particular, the fill rate of the trenches of the DFB is reduced by the presence of the residues. This changes the bandwidth of the reflector as well as the reflectivity thereof. The spectral width of the light radiation is thus increased. The accuracy of the emission wavelength decreases. As a result, a difference in wavelength can occur between light radiation emitted by a partially-filled DFB laser and a completely-filled DFB laser. This difference can be up to about 8 nm. The reproducibility of the lasers characteristics is limited.

There is thus a need to overcome the limitations suffered by the known solutions.

In particular, the present invention aims to provide a production method that allows the trenches of a distributed metal Bragg reflector to be completely filled.

SUMMARY

In order to achieve this objective, according to one embodiment, the invention provides for a method for forming a distributed Bragg reflector on a quantum cascade laser, comprising:

Providing a stack of III-V material-based layers, comprising at least one active region intended to emit monochromatic light radiation, Depositing a first masking layer on said stack, Forming first patterns in the first masking layer, Forming first trenches in the stack to a first depth D1 from the first masking patterns, said first trenches extending primarily in a first direction x and being intended to form patterns of the distributed Bragg reflector, Depositing a second masking layer at least inside the first trenches, Forming second patterns in the second masking layer on either side of the first patterns, Forming second trenches in the stack to a second depth D2, greater than the first depth D1, from the second masking patterns, said second trenches extending in a second direction y, perpendicular to the first direction x, and being intended to form sidewalls of the quantum cascade laser, Removing the second masking layer from inside the first trenches, Filling said first trenches with at least one metal material.

Advantageously, the method further comprises:

Before depositing the second masking layer, forming a sacrificial interlayer at least inside the first trenches, and Before filling said first trenches with the at least one metal material and after removing the second masking layer from inside the first trenches, removing said sacrificial interlayer.

Advantageously, this removal of said sacrificial interlayer allows for the removal, by lift-off, of the residues of the second masking layer remaining in the first trenches at the end of the step of removing the second masking layer from inside the first trenches.

Thus, the method allows the first trenches to be completely cleaned before filling with metal. The residues of the second masking layer, which are difficult to dissolve using known trench cleaning solutions, are advantageously removed here by detaching them from the sidewalls and/or from the bottom of the first trenches, using a so-called lift-off technique. The residues thus do not need to be etched or dissolved. The removal of the sacrificial interlayer allows the residues to be lifted off, which residues are then easily eliminated, for example mechanically, by the flow of the etching solution used to remove the sacrificial interlayer.

Figure 3:
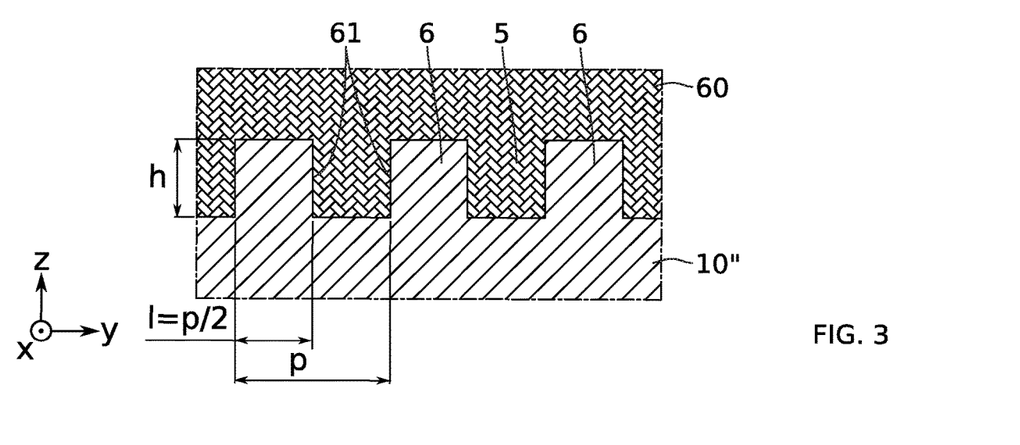
FIG. 3 diagrammatically shows a longitudinal sectional view of the corrugations—free of residues—of a Bragg reflector formed by the method according to one embodiment of the present invention.
Figure 4A:
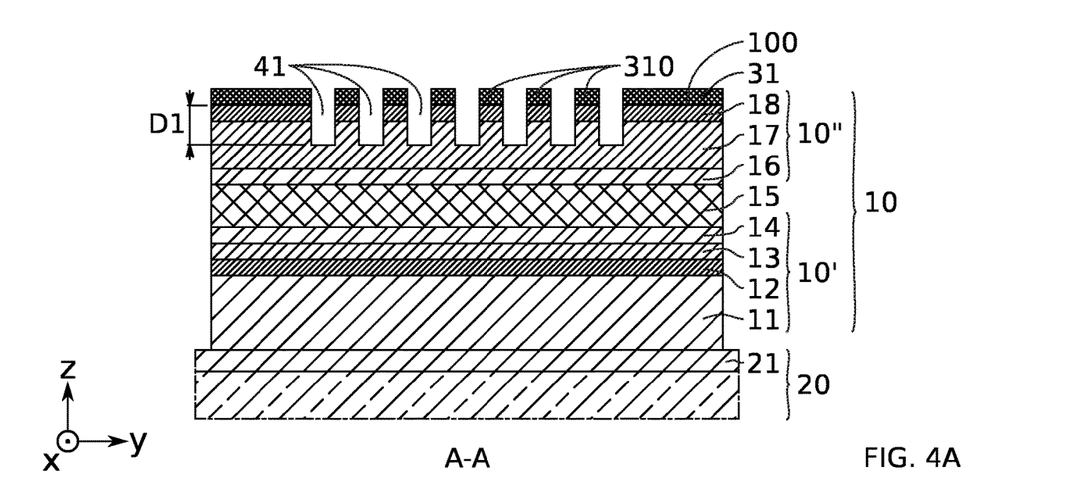
FIG. 4A, 5A, 6A, 7A, 8A, 9A, 10A diagrammatically show a longitudinal sectional view along the plane AA' shown in FIG. 1, of steps for manufacturing a DFB laser according to one embodiment of the present invention.
Figure 4B:
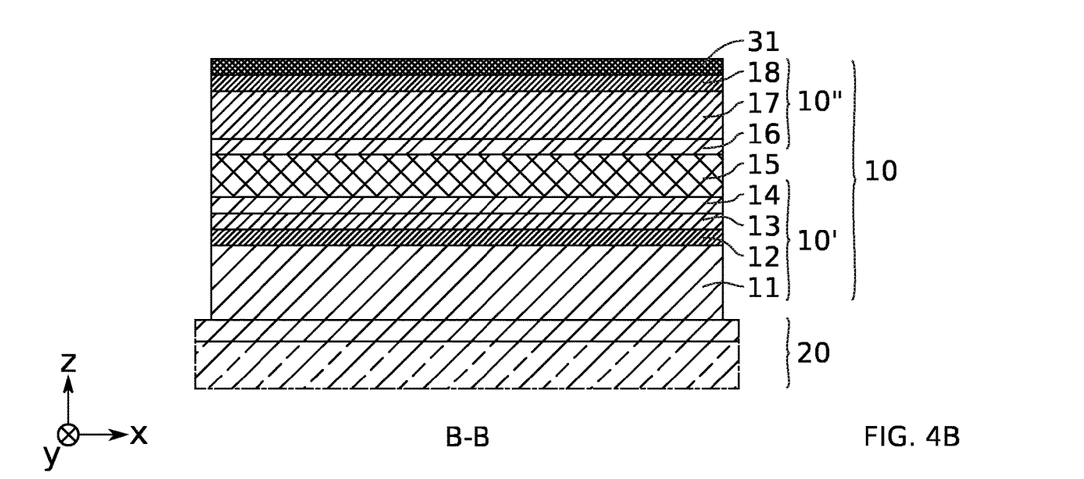
FIG. 4B, 5B, 6B, 7B, 8B, 9B, 10B diagrammatically show a cross-sectional view along the plane BB' shown in FIG. 1, of the steps for manufacturing a DFB laser according to one embodiment of the present invention, corresponding to the steps shown in FIG. 4A, 5A, 6A, 7A, 8A, 9A, 10A.

As shown in FIG. 3, the sidewalls 61 of the corrugations 6 are thus accessible to the metal during the deposition thereof. The method can thus increase the contact area between the metal on the one hand, and the corrugations and upper guide layers on the other hand, by about 66%. This ensures good electrical injection for the laser output.

The form factor of the metal structures 5 is improved. The fill rate of the structures 5, 6 of the Bragg reflector is thus improved. The spectral width variability of the Bragg reflector is significantly reduced. This ensures good spectral reproducibility of the laser output.

The use of the sacrificial interlayer in conjunction with the second masking layer thus optimises the filling of the array of first grating trenches with the metal. Control of the method for manufacturing the Bragg reflector of a DFB laser is thus improved. The implementation of the method is all the more advantageous the higher the height h of the corrugations, and/or the smaller the form factor p/(2·h) of the corrugations, which is typically less than 1, where p is the period of the Bragg grating.

The method thus enables DFB lasers to be produced with improved performance. The method is also typically based on a silicon technology compatible with a so-called CMOS production line (complementary metal-oxide-semiconductor transistor manufacturing).

BRIEF DESCRIPTION OF THE FIGURES

The aims, purposes, features and advantages of the invention will be better understood upon reading the detailed description of embodiments thereof, which are shown by means of the following accompanying drawings, in which.

The drawings are provided by way of example and are not intended to limit the scope of the invention. They constitute diagrammatic views intended to ease the understanding of the invention and are not necessarily to the scale of practical applications. In particular, in the schematic diagrams, the thicknesses of the different layers and the dimensions of the patterns are not representative of reality.

DETAILED DESCRIPTION

Before giving a detailed review of embodiments of the invention, optional features are set out below, which can be used in combination with or in replacement of one another.

According to one example, the sacrificial interlayer is silicon oxide-based and the second masking layer is silicon nitride-based. These two materials have good etch selectivity, typically for hydrofluoric acid-based wet etching. This facilitates removal by lift-off. These materials are also compatible with CMOS technology.

According to one example, the sacrificial interlayer has a substantially constant thickness e comprised between 100 nm and 300 nm. It can typically be formed by conformal deposition. A constant thickness allows for better control of the lift-off method.

According to one example, the first trenches are formed by anisotropic etching in a third direction z normal to the first and second directions x, y.

According to one example, the sacrificial interlayer is removed by wet etching with a hydrofluoric acid-based buffer solution. This allows for good etch selectivity in the case of a silicon oxide-based sacrificial interlayer and a second silicon nitride-based masking layer. A buffer solution can also improve control of the removal process during lift-off.

According to one example, the stack comprises an etch stop layer for the formation of the first trenches by etching, said etch stop layer being located at a depth substantially equal to D1 relative to a top face of the stack. End-point detection is typically used to monitor when the etch stop layer has been reached when etching the trenches. This makes it possible to stop etching once the depth D1 has been reached, thus significantly reducing or even eliminating the uncertainty about this etch depth. This is even more advantageous the greater the target depth D1, typically for $D1 \geq 1.5\lambda/4n_{eff}$, where $\lambda$ is a wavelength of the monochromatic light radiation and where $n_{eff}$ is an effective index.

According to one example, the etch stop layer is InGaAs-based and has a thickness e' comprised between 20 nm and 200 nm. An InGaAs-based etch stop layer typically has a refractive index low enough for laser applications. It is preferably doped, so as to allow for the transfer of carriers during operation of the laser. The thickness e' is preferably less than a critical thickness defining a plastic relaxation range. This results in an etch stop layer of a crystalline nature.

According to one example, the depth D1 is chosen such that D1 is approximately equal to $\lambda/4n_{eff}$, where $\lambda$ is a wavelength of the monochromatic light radiation and where $n_{eff}$ is an effective index.

According to one example, the depth D1 is chosen such that D1 is comprised between $0.5\lambda/4n_{eff}$ and $1.5\lambda/4n_{eff}$, where $\lambda$ is a wavelength of the monochromatic light radiation and where $n_{eff}$ is an effective index.

According to one example, the depth D1 is chosen such that D1 is greater than $1.5\lambda/4n_{eff}$, where $\lambda$ is a wavelength of the monochromatic light radiation and where $n_{eff}$ is an effective index.

According to one example, the first trenches are distributed such that they form a grating of period p approximately equal to $\lambda/2n_{eff}$, where $\lambda$ is a wavelength of the monochromatic light radiation and where $n_{eff}$ is an effective index.

According to one example, the first trenches have a width p/2 and a form factor $\varphi=p/(2\cdot D1)$. A width p/2 corresponds to a DFB fill rate of 50%, where p is the period of the distributed Bragg grating.

According to one example, the form factor $\varphi$ is greater than or equal to 0.8.

According to one example, the form factor $\varphi$ is less than or equal to 1.1.

According to one example, the method further comprises, after forming the second trenches, forming a passivation layer on the sidewalls of the quantum cascade laser.

It is specified that, within the scope of the present invention, the terms "on", "overlying", "covers", "underlying", "facing" and the equivalents thereof do not necessarily mean "in contact with". Thus, for example, the deposition of a first layer on a second layer does not necessarily mean that the two layers are directly in contact with one another, but rather means that the first layer covers at least partially the second layer while being either directly in contact therewith, or while being separated therefrom by at least one other layer or at least one other element.

Moreover, a layer can be constituted by a plurality of sub-layers made of the same material or made of different materials.

A material A-"based" substrate, stack or layer is understood to mean a substrate, stack or layer comprising this material A only or comprising this material A and optionally other materials, for example alloying elements or doping elements.

The doping ranges associated with the different types of doping indicated in the present application are as follows:
 p++ or n++ doping: greater than $1\times10^{20}$ cm$^{-3}$
 p+ or n+ doping: $1\times10^{18}$ cm$^{-3}$ to $9\times10^{19}$ cm$^{-3}$
 p or n doping: $1\times10^{17}$ cm$^{-3}$ to $1\times10^{18}$ cm$^{-3}$
 intrinsic doping: $1.10^{15}$ cm$^{-3}$ to $1.10^{17}$ cm$^{-3}$ The mid-infrared (MIR) region typically comprises wavelengths $\Delta$ between 3 μm and 12 μm. One example implementation of the method is given regarding the production of a DFB-QCL emitting at a wavelength of 7.4 μm.

Several embodiments of the invention implementing successive steps of the manufacturing method are described hereinbelow. Unless specified otherwise, the adjective "successive" does not necessarily imply that the steps immediately follow on from one another, although this is generally preferred, and they can be separated by intermediate steps.

Moreover, the term "step" is understood to mean the performance of a part of the method, and can denote a set of sub-steps.

Moreover, the term "step" does not necessarily mean that the actions carried out during a step are simultaneous or immediately successive. Certain actions of a first step can in particular be followed by actions related to a different step, and other actions of the first step can be resumed thereafter. Thus, the term step does not necessarily mean unitary and inseparable actions in time and in the sequence of the phases of the method.

One operating principle of the quantum cascade laser is that the active region is electrically biased so that electrons are injected. This active region comprises a multitude of quantum wells in which an electron will successively lose part of its energy, in a cascade, while emitting a photon of given energy each time. These photons form the light radiation of wavelength $\lambda$.

This light radiation propagates in a guided manner within an optical cavity. This optical cavity is typically bounded by lower and upper layers referred to as LOC (Low Optical Confinement) layers, and at least one Bragg reflector.

The Bragg reflector of the optical cavity typically has a reflectivity peak centred at wavelength $\lambda$.

This reflectivity peak has a certain spectral width $\delta\omega_{DBR}$.

This spectral width $\delta\omega_{DBR}$ (in nm) depends in particular on the corrugation factor $\kappa$ of the Bragg grating, also referred to as the grating strength, and the length of the Bragg grating $L_g$:

$$\delta\omega_{DBR} = \frac{\pi}{v_g\sqrt{|\kappa|^2 + \left(\frac{\pi}{L_g}\right)^2}}$$

Where $v_g$ is the group velocity of the light radiation.
The corrugation factor $\kappa$ can be expressed as:

$$\kappa = \frac{\pi \cdot n_{eff}}{\lambda} \frac{\int\int_\Omega n_{inf}^2 n_{sup}^2 E^2 dxdy}{\int\int E^2 dxdy}$$

Where $\Omega$ is the section of the optical mode propagating in the waveguide, $n_{inf}$ and $n_{sup}$ are respectively the refractive indices of the alternating structures or corrugations 5, 6 of the Bragg grating as shown in FIGS. 1 and 3, $n_{eff}$ is an effective index of the grating (weighted average of the indices related to the corrugations 5, 6) and E is the electric field of the light radiation outside the region perturbed by the corrugations.

Within the scope of the present invention, the terms "Bragg reflector", "Bragg grating" or "distributed Bragg reflector" or "DFB (Distributed FeedBack)" are used synonymously. The Bragg reflector is, in this case, configured for use as a reflector in a waveguide or in an optical cavity. It comprises alternating materials of different refractive indices. This alternation is reproduced at least twice within the scope of a Bragg reflector according to the present invention.

A preferably orthonormal coordinate system comprising the x, y, z axes is shown in the accompanying figures. If a single coordinate system is shown on a whole sheet of figures, this coordinate system applies to all the figures on that sheet.

In the present patent application, the thickness of a layer is considered in a direction normal to the main extension plane of the layer. Thus, a layer typically has a thickness along z. The relative terms "on", "overlying", "under" and "underlying" refer to positions taken in the z-direction.

The terms "vertical" and "vertically" refer to a direction along z. The terms "horizontal" and "horizontally" refer to a direction in the xy-plane.

An element located "vertical to" or "in line with" another element means that these two elements are both located on the same line perpendicular to a plane in which a bottom or top face of a substrate primarily extends, i.e. on the same line oriented vertically in the figures.

A first example implementation of the method is shown in FIG. 4A to 10B. In this example, a mesa comprising a stack 10 of III-V material-based layers is firstly bonded to a substrate 20, for example a silicon-based substrate. This bonding can typically be achieved by molecular bonding, for example via oxide-on-oxide or InP-on-oxide layers 21.

The mesa can take the form of a two-inch InP substrate on which the stack 10 is formed.

The stack 10 typically comprises a plurality of layers 11, 12, 13, 14, 15, 16, 17, 18 intended for the injection of the electrons, the emission of the light radiation and the guiding of the light radiation.

According to one possibility, the stack 10 can comprise, from the bonding layer 21 to the surface 100 of the stack along z:
- an n++ doped InP-based layer 11 having a thickness comprised between 1.5 µm and 5 µm,
- an n++ doped InGaAs-based layer 12 having a thickness comprised between 100 nm and 200 nm,
- an InP-based layer 13 having a thickness comprised between 100 nm and 200 nm,
- a so-called LOC InGaAs-based layer 14 having a thickness comprised between 20 nm and 200 nm.
- an active region 15 having a thickness comprised between 1.5 µm and 5 µm,
- a so-called LOC InGaAs-based layer 16 having a thickness comprised between 20 nm and 200 nm.
- an InP-based layer 17 having a thickness comprised between 1 µm and 3 µm,
- an n++ doped InGaAs-based layer 18 having a thickness comprised between 20 nm and 200 nm.

The n++ doped layers 11, 12, 18 typically contribute to the injection of the electrons into the active region 15. The LOC layers 14, 16 typically allow the light radiation to be confined to the active region 15. They typically have a low refractive index, for example in the order of 3.17 for a wavelength λ in the order of 7.4 µm, and are referred to as guide layers. The InP layer 17 is in part intended to be patterned to form a DFB reflector.

The active region 15 typically comprises a multitude of quantum wells through which electrons will cascade, emitting light radiation. According to one possibility, the active region 15 can comprise alternating layers of InGaAs and AlInAs. The reader can refer to the document "Carras, M. et al. Top grating index-coupled distributed feedback quantum cascade lasers. Appl. Phys. Lett. 93, 011109 (2008)" for the design of the active region, in particular for the choice of the InGaAs/AlInAs heterostructures, the number of periods and/or of quantum wells, and the resonant superlattice architecture.

After the stack 10 is provided (FIG. 9A, 9B), a masking layer 31 is formed on the surface 100 of the stack 10. This masking layer 31 can be conformally deposited by Plasma Enhanced Chemical Vapour Deposition (PECVD). It is preferably SiN-based. This masking layer 31 is intended to form a hard mask for the subsequent etching of the trenches 41 of the Bragg reflector. It can thus be patterned by photolithography and etching to form patterns 310. Alternatively, the masking layer 31 directly has a photolithography resin base.

The masking layer 31 is typically about 100 nm thick. This thickness of the masking layer 31 is preferably thin enough to form high-resolution and high-definition patterns 310.

The patterns 310 typically form a grating array of lines with a period p in the order of a few hundred nanometres, for example 1,165 nm for radiation of wavelength λ=7.4 µm. According to a preferred possibility, the grating period p is chosen such that $p=\lambda/2n_{eff}$.

Trenches 41 are then etched between the lines of the grating array to a depth D1. This etching can be carried out by anisotropic dry etching along z, for example by ICP (Inductively Coupled Plasma). The depth D1 is preferably chosen such that $D1=\lambda/4n_{eff}$. According to one possibility known from the US patent document No. 7567606 B2, the depth D1 can be chosen such that D1 is comprised between $0.5\lambda/4n_{eff}$ and $1.5\lambda/4n_{eff}$. For example, for radiation of wavelength λ=7.4 µm, the depth D1 is preferably comprised between 300 nm and 900 nm.

The strength of the DFB grating κ varies little in this range of etch depths D1. The reflectivity of the DFB is thus substantially constant. The performance of the laser comprising such a DFB reflector is stable and depends little on method-related variations in etch depth.

The trenches 41 typically pass through the InGaAs layer 18 and extend into the InP layer 17. They have a width l along y and a form factor φ=l/D1. According to a preferred possibility, the width l is equal to p/2. The form factor φ can be comprised between 0.8 and 1.1. Advantageously, the form factor φ can be less than 0.8. A form factor of less than 1 typically corresponds to deep trenches. A DFB comprising deep trenches has an increased grating strength. The DFB is thus more efficient and offers better coupling between the propagating and counter-propagating modes. The reflection of the DFB grating is increased. In particular, this allows a shorter laser cavity to be designed.

Figure 11:
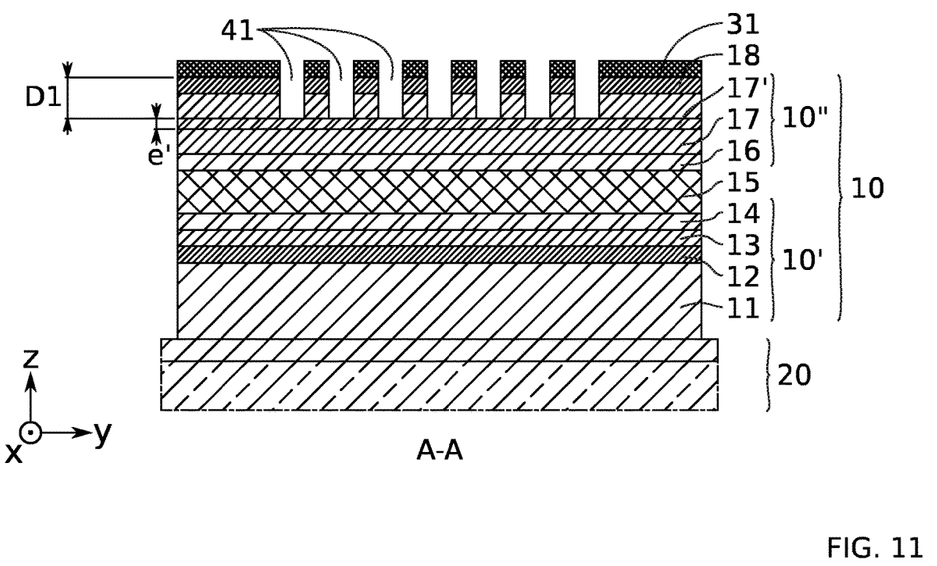
FIG. 11 diagrammatically shows a longitudinal sectional view of a stack comprising an etch stop layer for the etching of the first trenches, according to one embodiment of the method for manufacturing the Bragg reflector of the present invention.

According to an optional alternative embodiment shown in FIG. 11, an etch stop layer 17' is provided in the stack 10, typically within the InP layer 17. This etch stop layer 17' is intended to precisely control the stopping of the etching when etching the trenches 41. It can be located in the stack 10 at the depth D1 relative to the surface 100. Advantageously, the etch stop layer 17' is implemented for applications requiring a depth $D1 \geq 1.5\lambda/4n_{eff}$, i.e. in a range of depths outside the stability range of the corrugation factor κ. A depth $D1 \geq 1.5\lambda/4n_{eff}$ allows, for example, the length of the DFB laser cavity to be reduced. The etch stop layer 17' thus procures good reproducibility of the height of the corrugations 6 of the DFB reflector. The reproducibility of the method for manufacturing the DFB reflector is improved. Precise control of the depth of the trenches also allows the wavelength of the light radiation to be precisely defined.

The etch stop layer 17' can be InGaAs-based. It has a thickness e' in the order of a few nanometres to a few hundred nanometres. It is preferably doped, so as to allow for the transfer of carriers during operation of the laser. The thickness e' is preferably less than a critical thickness defining a plastic relaxation range. This results in a pseudo-morphic etch stop layer. This etch stop layer 17' is, for example, similar to low-index InGaAs LOC layers with thicknesses comprised between 20 nm and 200 nm. This improves the confinement of the optical mode of propagation of the light radiation. An InGaAs-based etch stop layer typically has a refractive index low enough for laser applications. This allows the optical mode of propagation of the light radiation to be better confined.

According to one possibility, the trenches are etched in the InP by HCL-based wet etching. Such a solution has good etch selectivity between InP and InGaAs. This allows for the selective etching of InP stopping on the InGaAs LOC etch stop layer 17'.

According to another possibility, the trenches are etched in the InP by dry etching, typically if the opening rate of the patterns 310 of the grating is higher than 10%. During the etching of trenches 41, the volatile etch products can be analysed in real time by spectroscopy. When the etch reaches the etch stop layer 17', the nature of the etch products changes. This change is detected by spectroscopy and etching is stopped. The layer 17' is thus advantageously used for end-of-etch detection, also known as end-point detection (EPD).

The rest of the method can be indifferently applied to both alternative embodiments—with or without an etch stop layer in the stack—described hereinabove.

Figure 5A:
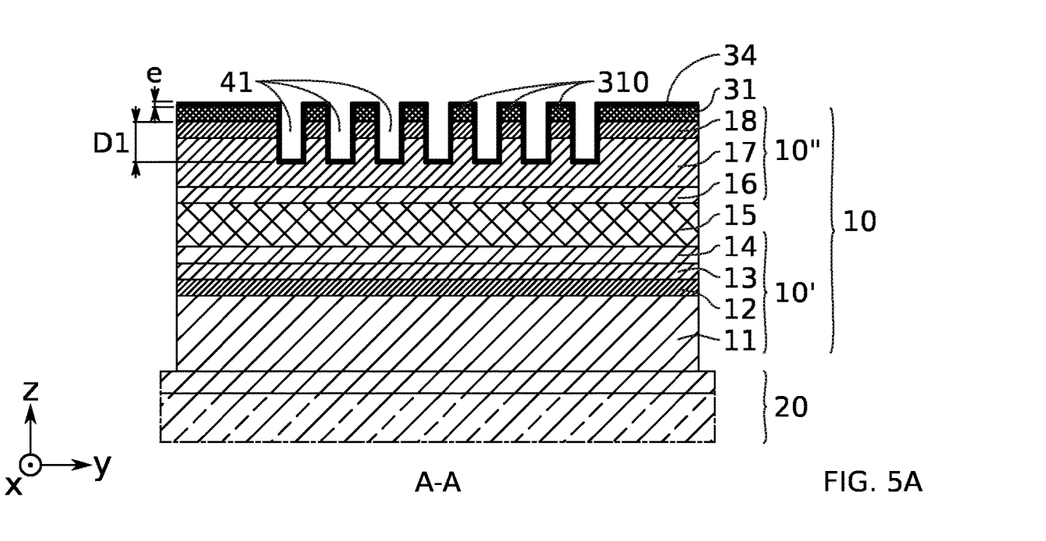
Figure 5B:
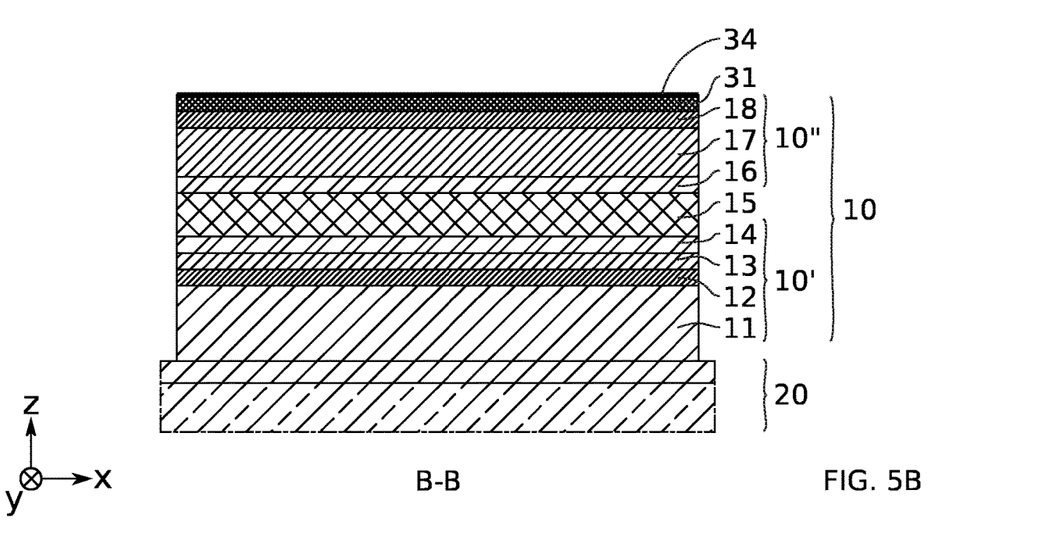

After forming the patterns 310 and the trenches 41, a sacrificial interlayer 34 is formed in the trenches 41 (FIG. 5A, 5B). This sacrificial interlayer 34 is preferably conformally deposited by Plasma Enhanced Chemical Vapour Deposition (PECVD). Alternatively, it can be deposited by Ion Beam Deposition (IBD) or by Atomic Layer Deposition (ALD). The sacrificial interlayer 34 can be silicon oxide-based. It has a thickness e in the order of a few nanometres to a few hundred nanometres. The thickness e of the sacrificial interlayer 34 is, for example, comprised between 100 nm and 300 nm.

Figure 6A:
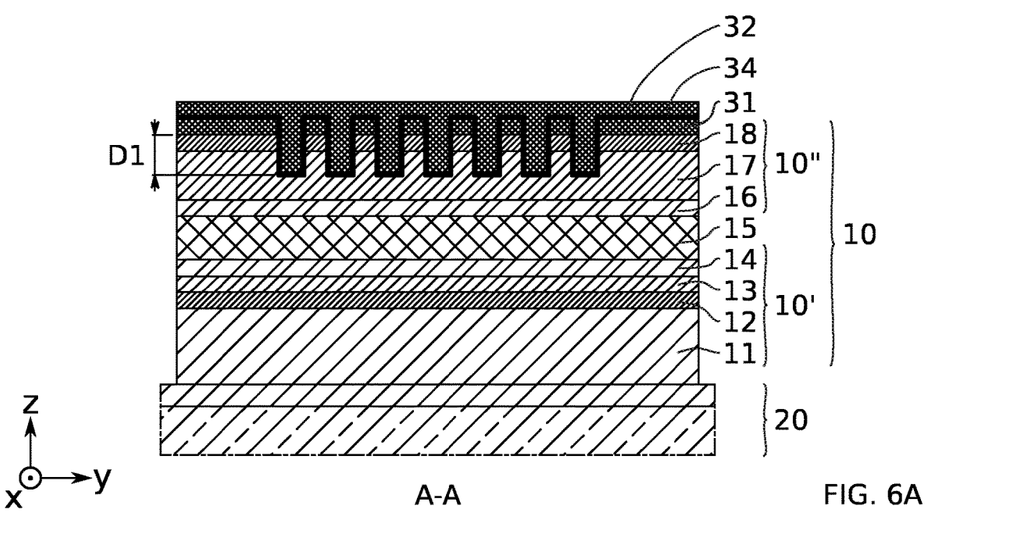
Figure 6B:
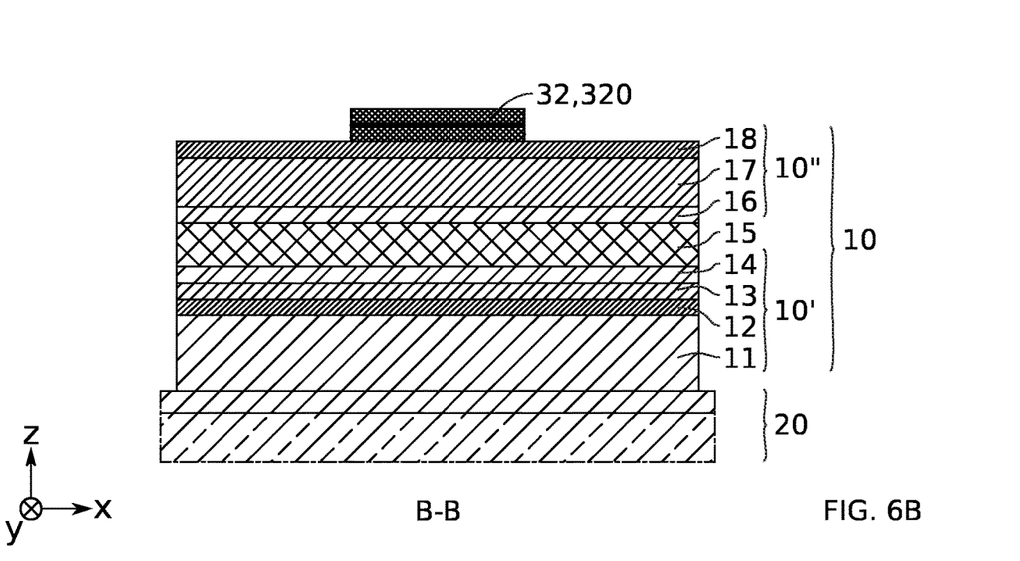

After forming the sacrificial interlayer 34, a second masking layer 32 is formed on the sacrificial interlayer 34 and in the trenches 41 (FIG. 6A, 6B). This masking layer 32 can be conformally deposited by Plasma Enhanced Chemical Vapour Deposition (PECVD). It is preferably SiN-based. This masking layer 32 is intended to form a hard mask for the subsequent etching of the ribbon pattern of the laser. It can thus be patterned by photolithography and etching, so as to form one or more patterns 320, at least on the array of grating trenches 41 of the DFB reflector.

The masking layer 32 typically has a thickness comprised between 400 nm and 600 nm, as a function of the depth to be etched when the ribbon pattern of the laser is etched. Such a thickness of the masking layer 32 protects the trenches and the underlying stack when the ribbon pattern of the laser is etched.

The pattern 320 typically forms a rectangle covering the array of grating trenches 41, with long sides extending along y on either side of the trenches 41 over a distance defining the cavity length of the laser. This cavity length can reach several millimetres, for example 4 mm. The short sides of this rectangular pattern 320 extend along x over a distance defining the cavity width of the laser. This cavity width can be in the order of a few microns to a few tens of microns, for example in the order of 8 μm or 10 μm. It can be greater than or equal to the dimension of the trenches along x.

Figure 7A:
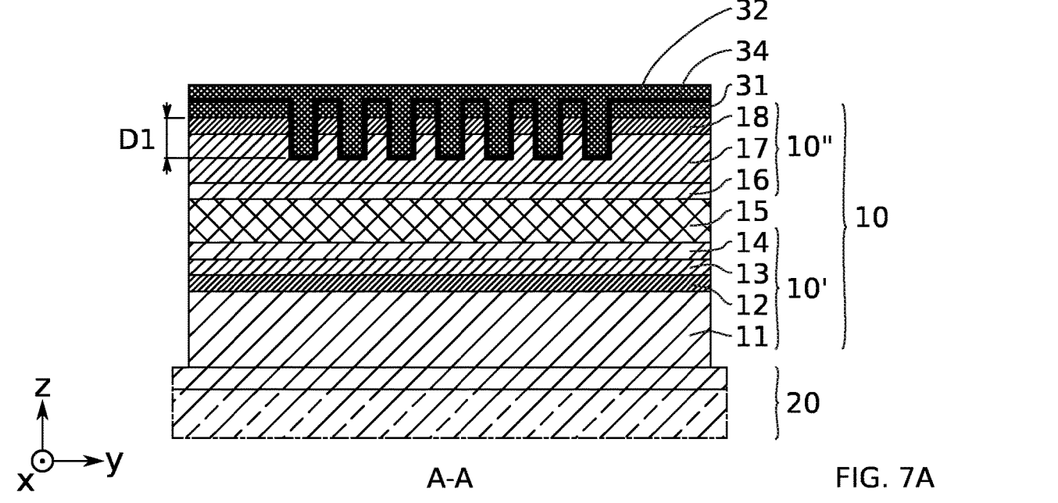
Figure 7B:
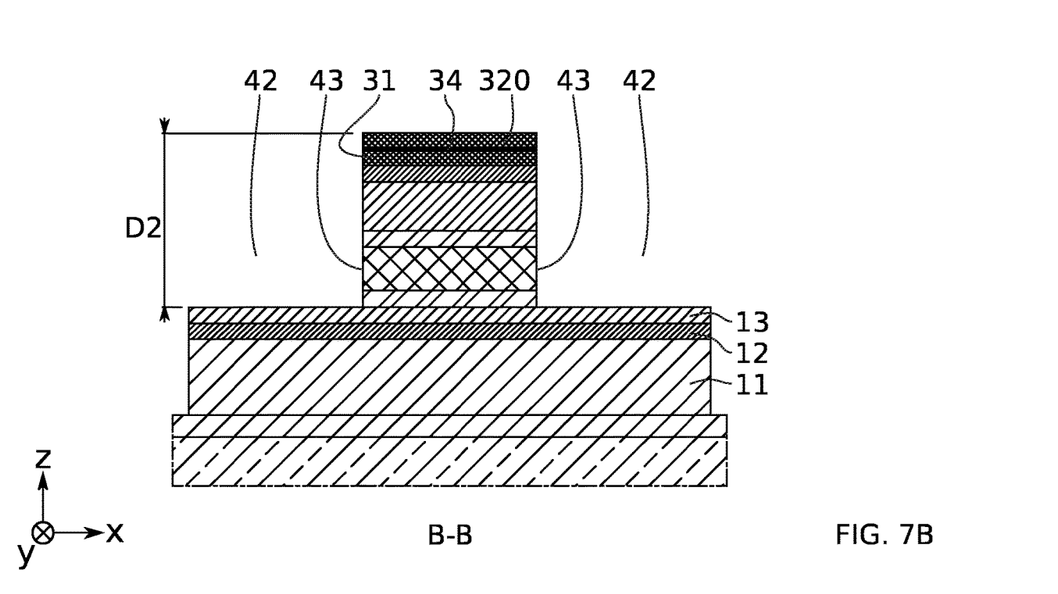

Trenches 42 are then etched on either side of the pattern 320 to a depth D2 (FIG. 7A, 7B). This etching can be carried out by anisotropic dry etching along z, for example by ICP (Inductively Coupled Plasma). The etching is preferably configured to be stopped in the InP layer 13. This etching forms a ribbon comprising the active region 15 in the stack 10 made of III-V materials. This ribbon forms a waveguide for the light radiation.

Figure 8A:
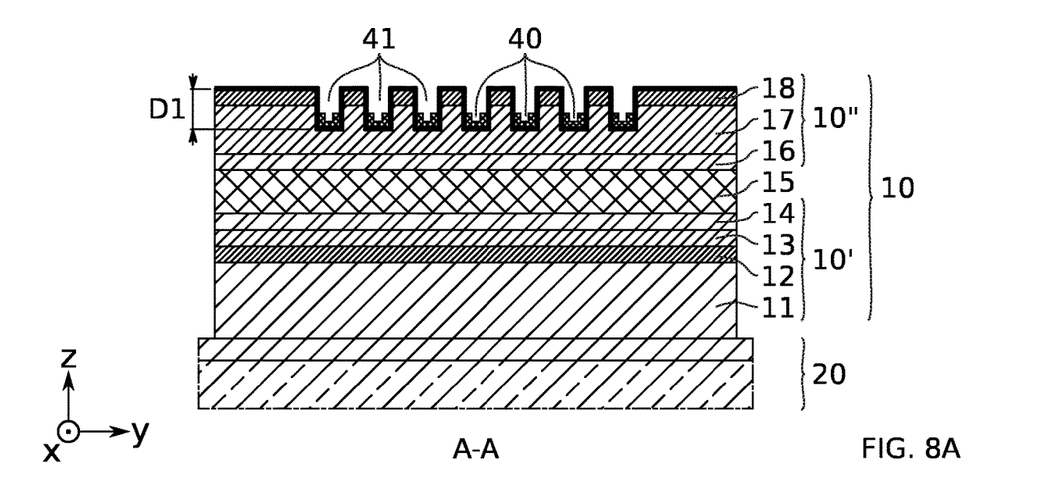
Figure 8B:
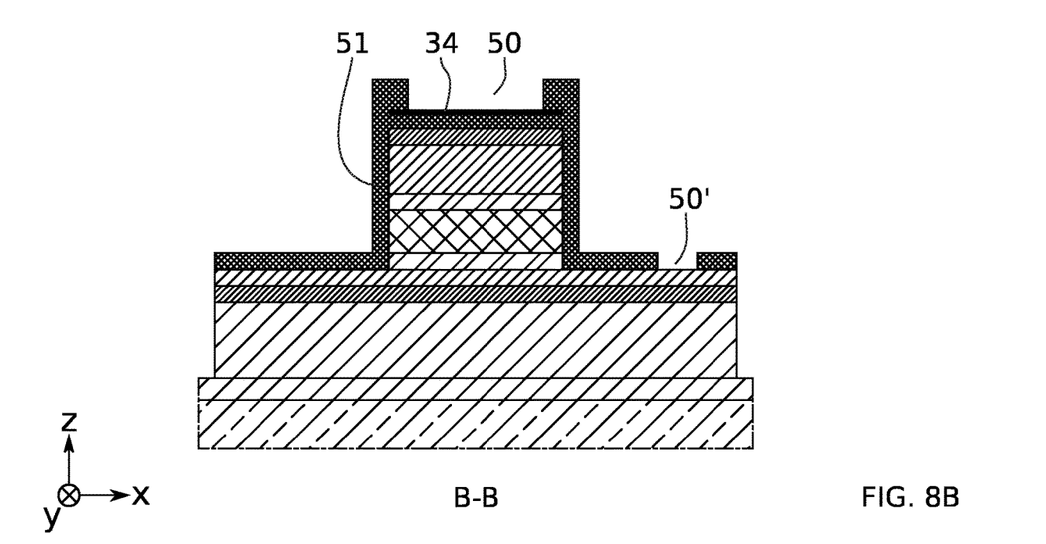

The sidewalls 43 of the ribbon are then passivated, preferably by depositing a passivation layer 51 made of SiN, for example with a thickness comprised between 400 nm and 900 nm (FIG. 8A, 8B). Openings 50, 50' are formed in the passivation layer 51, for example by plasma RIE (Reactive Ion Etching), so as to define an upper contact area at the trenches 41, and a lower contact area at the InP layer 13.

At this stage, SiN residues 40 are typically present at the bottom of the trenches 41 (FIG. 8A).

Figure 9A:
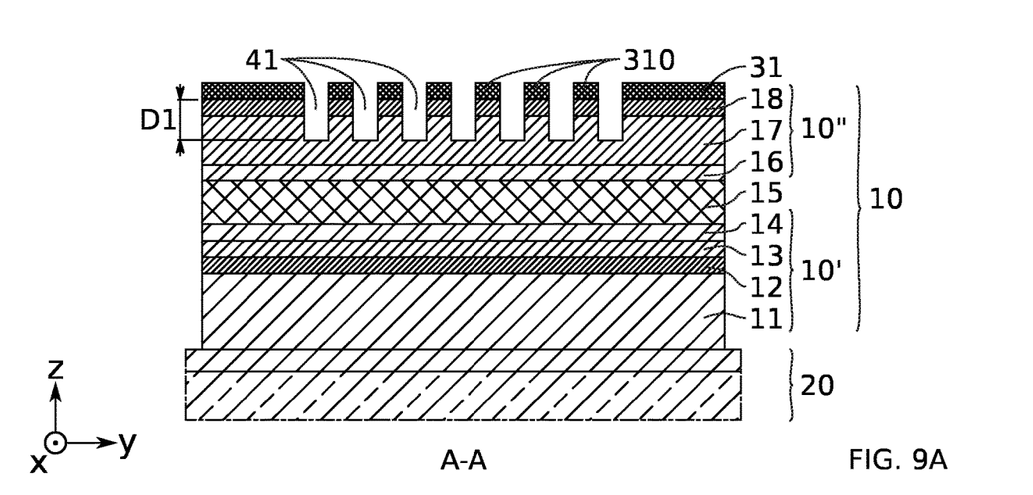
Figure 9B:
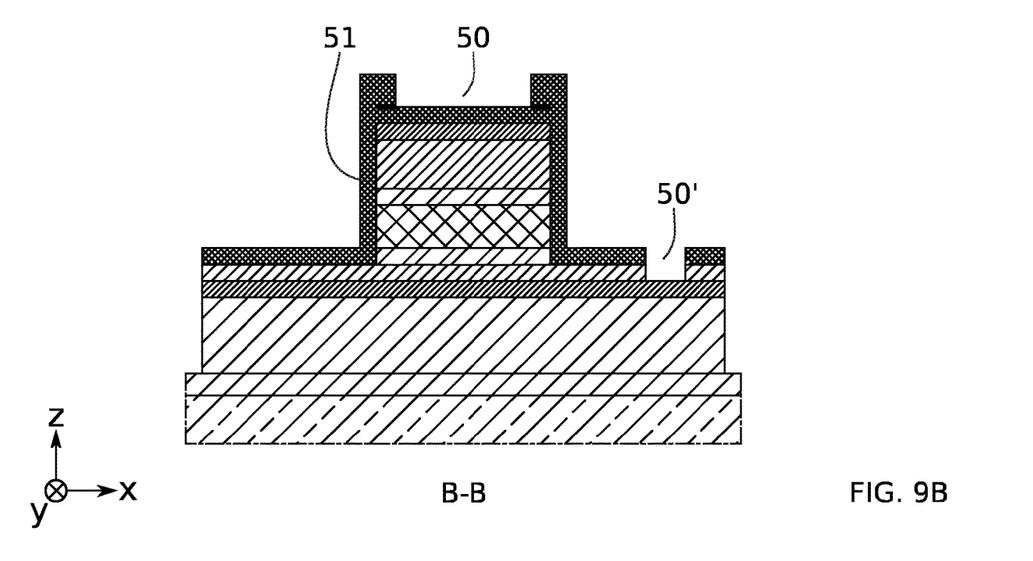

These residues 40 are advantageously removed by lift-off when etching the sacrificial interlayer 34 (FIG. 9A, 9B). This etching is preferably carried out wet, using a so-called BOE ("Buffer Oxide Etch") solution. Such a BOE solution can advantageously be used to etch a thin layer of silicon dioxide SiO2, such as the sacrificial interlayer 34. This solution typically consists of a buffer, such as ammonium fluoride NH4F, and hydrofluoric acid HF. This makes the hydrofluoric acid a little less reactive and thus procures better control over the etching reaction. For example, a 7:1 ratio of ammonium fluoride to hydrofluoric acid can be used.

Such removal of the sacrificial interlayer 34 is selective to the SiN of the residues 40. It thus allows the residues 40 to be lifted off. These are then removed without being completely dissolved, for example by the flow of the BOE etching solution or during the rinsing method consecutive to this etch.

The InP layer 13 can be etched by chemical etching or plasma etching stopping on the InGaAs layer 12, before the electrical contacts are formed (FIG. 9B). According to another possibility, the layer 12 can be doped InAlAs-based. This also procures good etch selectivity towards InP.

Figure 10A:
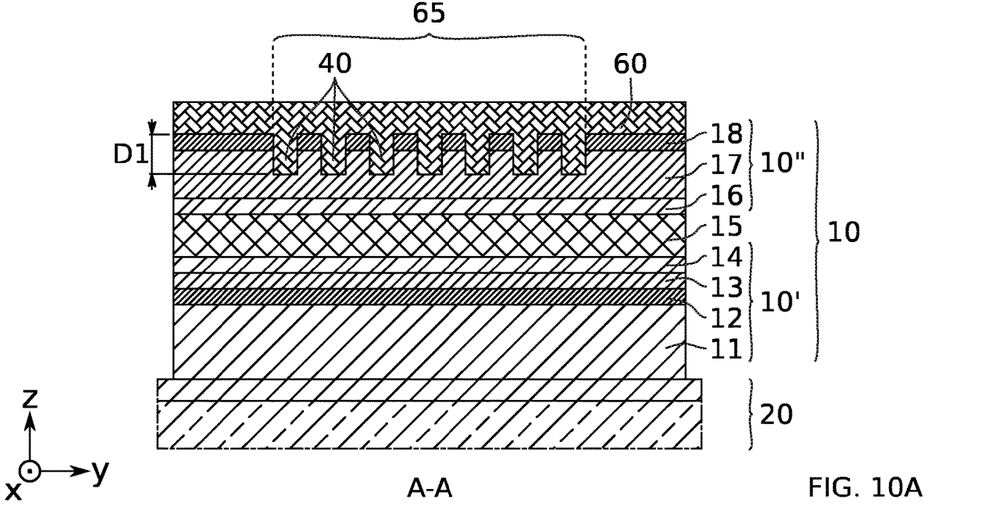
Figure 10B:
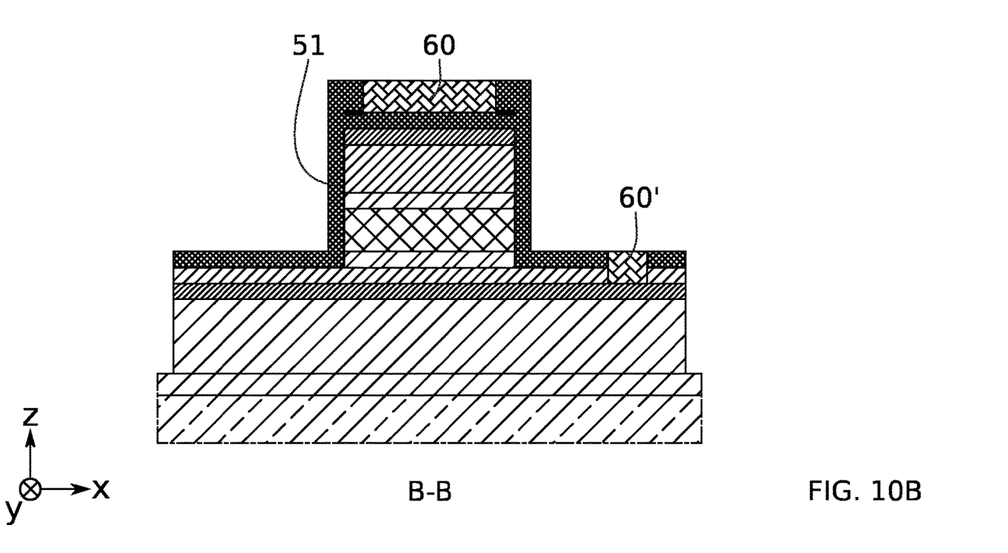

Once the sacrificial interlayer 34 has been removed, the trenches 41 are advantageously free of residues. They can thus be completely filled with metal during the subsequent metal deposition (FIG. 10A, 10B). This metal deposit can typically take the form of a stack of Ti/TiN/Au-based metal layers. The stack of metal layers can have a thickness comprised between 1 μm and 3 μm. The patterning of this metal deposit by photolithography/etching defines and forms the DFB Bragg reflector 65 and the electrodes 60, 60'.

In light of the above description, it is clear that the proposed method offers a particularly effective solution for producing metal/InP Bragg reflectors on a CMOS-compatible InP die. The method for manufacturing the DFB is also simplified. The DFB reflector thus formed is particularly effective both optically, due to the high InP/metal index contrast, and electrically, due to its function as an electrical injection electrode.

The invention is not limited to the aforementioned embodiments, and includes all the embodiments covered by the claims.

In particular, the DFB-QCLs produced by this method can have other architectures, for example in a so-called double trench configuration. Such a configuration in particular allows a more extensive planar surface to be obtained during the subsequent welding and conditioning steps.

The invention claimed is:

1. A method for forming a distributed Bragg reflector on a quantum cascade laser, comprising:
   providing a stack of III-V material-based layers, comprising at least one active region to emit monochromatic light radiation,
   depositing a first masking layer on said stack,
   forming first patterns in the first masking layer, forming first trenches in the stack to a first depth D1 from the first masking patterns, said first trenches extending primarily in a first direction and being intended to form structures of the distributed Bragg reflector, depositing a second masking layer at least inside the first trenches, forming second patterns in the second masking layer on either side of the first patterns, forming second trenches in the stack to a second depth D2, greater than the first depth D1, from the second masking patterns, said second trenches extending primarily in a second direction, perpendicular to the first direction to form sidewalls of the quantum cascade laser, removing the second masking layer from inside the first trenches, and filling said first trenches with at least one metal material, wherein the method further includes before depositing the second masking layer, forming a sacrificial interlayer at least inside the first trenches, and before filling said first trenches with the at least one metal material and after removing the second masking layer from inside the first trenches, removing said sacrificial interlayer so as to remove, by lift-off, residues of the second masking layer remaining in the first trenches at the end of the step of removing the second masking layer from inside the first trenches.

2. The method according to claim 1, wherein the sacrificial interlayer is silicon oxide-based.

3. The method according to claim 1, wherein the second masking layer is silicon nitride-based.

4. The method according to claim 1, wherein the sacrificial interlayer has a substantially constant thickness e between 100 nm and 300 nm.

5. The method according to claim 1, wherein the sacrificial interlayer is removed by wet etching with a hydrofluoric acid-based buffer solution.

6. The method according to claim 1, wherein the stack comprises an etch stop layer for the formation of the first trenches by etching, said etch stop layer being located at a depth substantially equal to D1 relative to a top face of the stack.

7. The method according to claim 6, wherein the etch stop layer is InGaAs-based and has a thickness e' between 20 nm and 200 nm.

8. The method according to claim 6, wherein the depth D1 is chosen such that D1 is greater than $1.5\lambda/4n_{eff}$, where $\lambda$ is a wavelength of the monochromatic light radiation and where $n_{eff}$ is an effective index.

9. The method according to claim 1, wherein the first trenches are distributed such that they form a grating of period p approximately equal to $\lambda/2n_{eff}$, where $\lambda$ is a wavelength of the monochromatic light radiation and where $n_{eff}$ is an effective index.

10. The method according to claim 9, wherein the first trenches have a width p/2 and a form factor $\varphi=p/(2.D1)$ such that $0.8 \leq \varphi \leq 1.1$.

11. The method according to claim 1 further comprising, after forming the second trenches, forming a passivation layer on the sidewalls of the quantum cascade laser.

* * * * *